US008520346B2

(12) United States Patent
Ando

(10) Patent No.: US 8,520,346 B2
(45) Date of Patent: Aug. 27, 2013

(54) ABNORMALITY DETECTION CIRCUIT, LOAD DRIVING DEVICE, AND ELECTRICAL APPARATUS

(75) Inventor: Motohiro Ando, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 218 days.

(21) Appl. No.: 13/018,578

(22) Filed: Feb. 1, 2011

(65) Prior Publication Data
US 2011/0188163 A1    Aug. 4, 2011

(30) Foreign Application Priority Data

Feb. 3, 2010    (JP) .................................. 2010-021747

(51) Int. Cl.
*H02H 3/00*    (2006.01)
(52) U.S. Cl.
USPC .............................................. 361/23; 361/42
(58) Field of Classification Search
USPC ...................................................... 361/23, 42
See application file for complete search history.

(56) References Cited

U.S. PATENT DOCUMENTS 5,969,919 A * 10/1999 Kobayashi et al. ............. 361/23
6,335,600 B1 * 1/2002 Kasai et al. .................... 318/434

FOREIGN PATENT DOCUMENTS

| JP | 05-111144 | 4/1993 |
| JP | 05-111145 | 4/1993 |
| JP | 11-206189 | 7/1999 |
| JP | 2004-186874 | 7/2004 |

* cited by examiner

*Primary Examiner* — Danny Nguyen
(74) *Attorney, Agent, or Firm* — Fish & Richarson P.C.

(57) ABSTRACT

An abnormality detection circuit monitors the sink current Irnf of a H-bridge circuit and determines the presence of an abnormal state if the sink current is not detected for a predetermined time. The abnormality detection circuit includes a clock pulse generator, a counter and a NMOS transistor. The abnormality detection circuit includes a clock pulse generator arranged to generate a clock pulse of a predetermined frequency, and a counter arranged so that a count value is incremented every time the clock pulse is provided to the counter and arranged so that the count value is reset when the sink current is detected. The counter generates a first abnormality detection signal that changes from a normal logic level to an abnormal logic level when the count value reaches a predetermined value without being reset.

19 Claims, 12 Drawing Sheets

FIG. 11

| S6 | S11 | S6a | S6b | S7a | S7b | RESULT OF DETERMINATION |
|---|---|---|---|---|---|---|
| H | H | H | L | L | H | GROUND FAULT |
| H | L | L | H | H | L | OPEN FAULT |
| L | — | L | L | H | H | NO FAULT |

ABNORMALITY DETECTION CIRCUIT, LOAD DRIVING DEVICE, AND ELECTRICAL APPARATUS

CROSS-REFERENCE TO RELATED APPLICATIONS

This application claims the benefit of priority of Japanese patent application No. 2010-021747 (filing date: Feb. 3, 2010), which is incorporated herein by reference in its entirety.

BACKGROUND OF THE INVENTION

1. Field of the Invention

This disclosure relates to a detection circuit to detect a short-to-ground fault (ground fault) or an open fault of an external terminal connected to a load, and relates to a load driving device and an electrical apparatus using the detection circuit.

2. Description of Related Art

A motor driving device is known to detect a current flowing through switching elements of an output stage and to maintain the current at a predetermined target value by chopping an ON period of the switching elements. An example of the motor driving device using the technique (i.e., a constant current chopping function) is disclosed in Japanese patent publication No. H11-206189.

Also a motor driving device is known to detect an over current flowing through switching elements of an output stage and then turns OFF the switching elements forcefully. Examples of motor driving devices using the technique (i.e., an over current protection function) are disclosed in Japanese patent publication No. H05-111144 and in Japanese patent publication No. H05-111145.

The constant current chopping function or the over current protection function of a conventional motor driving device may not be operated normally under specific motor driving conditions. This can result in an abnormal over heating of a motor, breakage of a motor or breakage of a motor driving device.

Each of FIG. 12A and FIG. 12B shows a diagram of a motor driving device in accordance with the related art (showing a H-bridge circuit of an output stage). In a first operating state shown in FIG. 12A, transistors FET1 to FET4 form a H-bridge circuit, the transistors FET1 and FET4 are turned ON, and the transistors FET2 and FET3 are turned OFF. In a second operating state shown in FIG. 12B, the transistors FET1 and FET4 are turned OFF, and the transistors FET2 and FET3 are turned ON.

According to the related art, when a coil current is driven by the motor driving device for each phase of the stepping motor, as the motor is rotating (e.g., while a stepping pulse is provided), the H-bridge circuit alternates between a first operating state and a second operating state every time a stepping pulse (not illustrated) is provided to the stepping motor. On the other hand, as the motor is not rotating (e.g., while a stepping pulse is stopped), the H-bridge circuit is held either in the first operating state or in the second operating state.

When a coil current is driven for a brushed DC motor by a motor driving device according to the related art, while the motor is rotating in a first direction (e.g., in a forward rotation), the state of the H-bridge circuit is held in the first operating state. On the other hand, while the motor is rotating in a second direction adverse to the first direction (e.g., in a reverse rotation), the state of the H-bridge circuit is held in the second operating state.

For a motor driving device in accordance with the above mentioned related art, the constant current chopping function is accomplished by detecting sink current flowing through the H-bridge circuit using a resistor RNF, and by maintaining the detected sink current at a predetermined target value by chopping an ON period of the transistors FET1 to FET4.

For a motor driving device in accordance with the above mentioned related art, the over current protection function is accomplished by detecting the current flowing through the transistors FET1 to FET4, and by turning OFF the transistors FET1 to FET4 forcefully when it is determined that an over current has occurred because even one of the detected currents exceeds the predetermined upper value (e.g., 4.5 A).

The following description regarding the related art is based on an assumption when a point Y (i.e., a low level output terminal of the H-bridge circuit operating as the first operation state) becomes a ground fault during the H-bridge circuit is kept as the first operation state. In this description, a ground fault means an abnormal state when an output terminal is short-circuited to a ground terminal or a low level potential.

When the H-bridge circuit is operating in the first operating state, if the point Y becomes the ground fault, a current Ia from a power source input terminal to a coil L1 via the transistor FET1 flows through to a ground terminal via a current path caused by the ground fault (i.e., not a current path via the transistor FET4 and the resistance RNF). In such a situation, the sink current does not flow through the resistor RNF of the H-bridge circuit, and the foregoing constant current chopping function does not work. Thus both transistors FET1 and FET4 are in the ON state (i.e., no chopping state). As a result, the voltage level of point X (i.e., a high level output terminal of the H-bridge circuit operating in the first operating state) becomes 18V (i.e., VCC), and the voltage level of point Y becomes 0V (i.e., GND).

At this time, as indicated by formula (1) below, a current value of the current Ia is adjusted by a wire wound resistance value RL of the coil L1, by the ON resistance Ron1 of the transistor FET1 (e.g., Ron=0.6 ohm) and by a power source voltage VCC (e.g., VCC=18V).

$$Ia = VCC/(RL + Ron1) \quad (1)$$

If the wire wound resistance value RL of the coil L1 is a relatively small value and the current Ia exceeds the predetermined upper value (e.g. 4.5 A) when the current Ia is not restricted by the coil L1, the foregoing over current protection function works, and the transistors FET1 to FET4 are turned OFF forcefully. The function does not depend on whether or not current is flowing through the resistance RNF.

However, if the wire wound resistance value RL of the coil L1 is relatively large and the current Ia does not reach the predetermined upper value, the foregoing over current protection function does not work. As a result, the current Ia, which does not reach the over current protection value, flows through the motor driving device continuously. This results in abnormal overheating or breakage of the motor or breakage of the motor driving device. The possibility of breakage mostly increases if the current Ia continues to flow through, such that the current value reaches an absolute maximum rating value and does not reach the over current protection value.

When the H-bridge circuit is converted from the first operating state to the second operating state (i.e., in the case of the rotating state of the stepping motor, or in case of the converting state from forward rotation to reverse rotation of the brushed DC motor), a current Ib flowing from the power source terminal to the ground terminal via the transistor FET2 does not flow via the coil L1, the transistor FET3 and the resistance RNF. The current Ib flowing from the power source terminal to the ground terminal via the transistor FET2 flows thorough a current path caused by the ground fault.

Thus, as indicated by formula (2) below, the current Ib does not flow through the coil L1, and the value of the current Ib is adjusted by the ON resistance Ron2 of the transistor FET2 (e.g., Ron=0.6 ohm) and a power source voltage VCC (e.g., VCC=18V).

$$Ib=VCC/Ron2=18/0.6=30A \quad (2)$$

A value of the current Ib is limited to a small value calculated by the foregoing formula (2) according to the current driving capability of the power source or the current driving capability of the transistor FET2. Nevertheless, the value of the current Ib exceeds the predetermined value (e.g., 4.5 A) considerably, and the foregoing over current protection function works. Thus, the transistors FET1 to FET4 are turned OFF forcefully.

As described above, when using the motor driving device of the related art under certain conditions (e.g., when a point Y becomes ground fault while the H-bridge circuit is maintained in the first operating state), the constant current chopping function or the over current protection function do not work properly. This can result in an abnormal overheating or breakage of the motor or breakage of the motor driving device.

Furthermore, apart from the ground fault, when using the motor driving device of the related art, there is a possibility of a connection detach occurring between the motor driving device and the motor (i.e., open fault). In such a case, the motor is no longer able to operate properly, though there is an electrical apparatus which continues to operate properly after functioning of one of the motors has been stopped.

For example, if there is an open fault with a motor for a toner box to withdraw the used toner in a copy machine, the copy function continues to operate normally until the toner box withdraws the used toner is fulfilled with the used toner. Also, if there is an open fault with a motor for toner distribution, the print function is able to continue to operate for some time without an affection to the printed out characters.

With respect to the above mentioned copy machine, the open fault can be detected after some time for the first time as a toner withdrawing error or with a printed character error. In other words, for the foregoing copy machine, there is a possibility of causing fatal damage to the entire machine caused by a normal operation after the motor has been abnormally stopped.

Also, it is difficult to identify a motor of an abnormal state for the electrical apparatus with multiple motors. It requires time for maintenance, and there can be situations in which it is not possible to identify the broken portion; exchange for the entire circuit board may be required.

Load driving devices which include a H-bridge circuit as an output stage can have same kind of problem as described above with respect to the motor driving device.

SUMMARY

In some implementations, the disclosure provides an abnormality detection circuit and a load driving device and an electrical apparatus using the same which is able to detect a ground fault or an open fault for a terminal that should be connected to a load without fail.

According to one aspect, an abnormality detection circuit includes first circuitry arranged to monitor a sink current which flows through a H-bridge circuit, and includes second circuitry arranged to determine the presence of an abnormal state if the sink current is not detected by the first circuitry for a predetermined time.

Other features, elements, steps, advantages, and characteristics will be apparent from the following description, the drawings, and the claims.

BRIEF DESCRIPTION OF THE DRAWINGS

FIG. 11 is a diagram showing an input-output logic of determination circuitry 55.

DETAILED DESCRIPTION OF PREFERRED EMBODIMENTS

Figure 1:
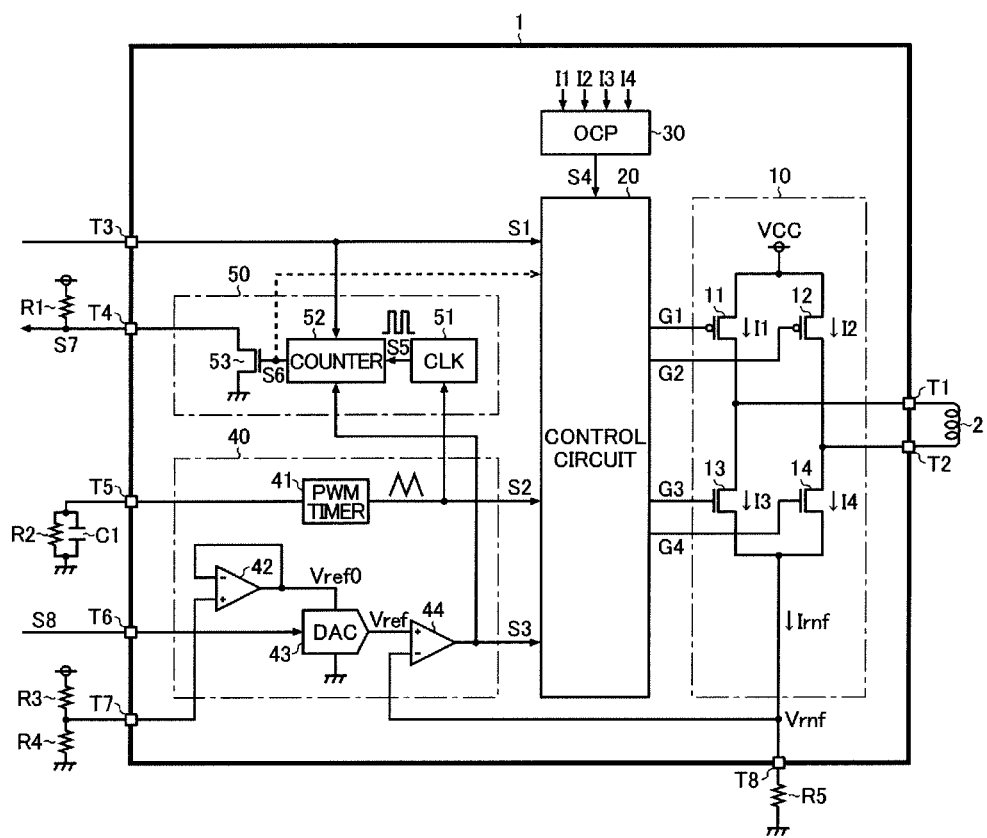
FIG. 1 is a diagram showing an example of a motor driving IC in accordance with an embodiment of the invention.

As shown in FIG. 1, a motor driving IC 1 includes a H-bridge circuit 10, a control circuit 20, an over current protection circuit 30, a constant current chopping circuit 40, and an abnormality detection circuit 50.

The motor driving IC 1 includes external terminals T1 to T8 to establish an electrical connection with exterior portion. A motor coil 2, resistances R2 to R5, and a capacitor C1 are externally connected to the motor driving IC 1.

The H-bridge circuit 10 is an output stage to drive a coil current flowing through the motor coil 2 externally connected between external terminals T1 and T2. The H-bridge circuit includes PMOS (metal oxide semiconductor) transistors 11 and 12, and includes NMOS transistors 13 and 14.

Both sources of the transistors 11 and 12 are connected to the power source terminal. Both drains of the transistors 11 and 13 are connected to an external terminal T1. Both drains of the transistors 12 and 14 are connected to an external terminal T2. Both sources of the transistors 13 and 14 are connected to an external terminal T8. The external terminal T8 is connected to a ground terminal via an externally installed sense resistor R5. Each gates of the transistors 11 to 14 is connected to output terminals of gate signals G1 to G4 of the control circuit 20. Thus, the transistors 11 to 14 correspond to four switching elements connected to the external terminals T1 and T2 that should be respectively connected to both ends of the motor coil 2, and the transistors 11 to 14 form a H-bridge shape.

When controlling a DC brushed motor using the motor driving IC 1, a single H-bridge circuit 10 is used. When controlling a two-phase excitation stepping motor by the motor driving IC 1, two pairs of the H-bridge circuit 10 are used.

The controlling circuit 20 generates gate control signals G1 to G4 for the transistors 11 to 14 and controls the ON-OFF state for each of the transistors. For example, when driving a coil current for each phases of a stepping motor, while the motor is rotating (while the stepping pulse is being provided), the H-bridge circuit 10 is alternately converted between a first operating state (a state in which the transistors 11 and 14 are ON and the transistors 12 and 13 are OFF) and a second operating state (a state in which the transistors 11 and 14 are OFF and the transistors 12 and 13 are OFF) every time a stepping pulse (not illustrated) is provided to the H-bridge circuit 10.

Meanwhile, when the motor is held (i.e., while a stepping pulse is not provided), the H-bridge circuit 10 is held in either the first operating state or the second operating state. Also, when controlling a DC brushed motor using the motor driving IC 1, the H-bridge circuit 10 is held in the first operating state while the motor is rotating to a first direction (forward rotation), and the H-bridge circuit 10 is held in the second operating state while the motor is rotating to a second direction (reverse rotation).

The control circuit 20 determines whether or not to control the ON-OFF state of the transistors 11 to 14 according to an enable signal S1 provided to the circuit 20 via an external terminal T3. The control circuit 20 controls the ON-OFF state of the transistors 11 to 14 when the enable signal S1 is at a high level (an enable logic level); the ON-OFF control for the transistors 11 to 14 is not enabled when the enable signal S1 is at a low level (a disable logic level).

The control circuit 20 determines whether or not to turn OFF the transistors 11 to 14 forcibly in accordance with an over current protection signal S4 provided from the over current protection circuit 30. To be more concrete, the control circuit 20 turns OFF the transistors 11 to 14 forcibly regardless of the state of the enable signal S1 when the over current protection signal S4 is high level (an abnormal logic level). The determination to control ON-OFF control for the transistors 11 to 14 is made in accordance with the enable signal S1 when the over current protection signal S4 is at a low level (a normal logic level).

The over current protection circuit 30 compares a current flowing through the transistors 11 to 14 with a predetermined upper value (an over current protection value), then generates the over current protection signal S4 to the control circuit 20. The over current protection signal S4 is used to determine whether or not to turn OFF the transistors 11 to 14 forcibly.

Figure 2:
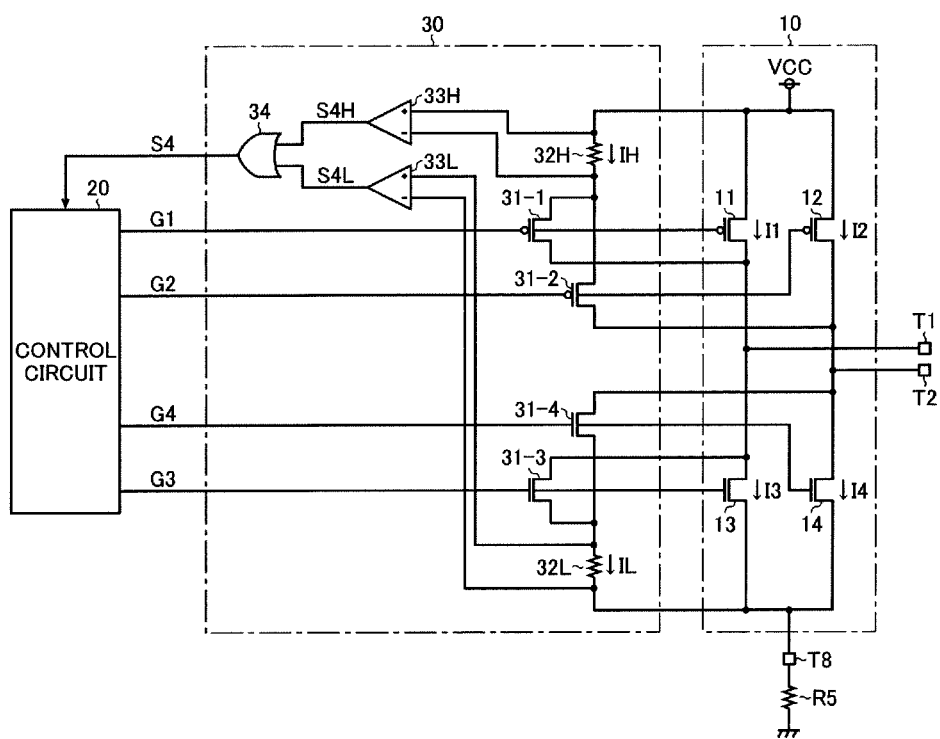
FIG. 2 is a diagram showing an example of an over current protection circuit 30.

FIG. 2 is a diagram showing an example of an over current protection circuit 30. As shown in FIG. 2, the over current protection circuit 30 includes PMOS transistors 31-1 and 31-2, NMOS transistors 31-3 and 31-4, a sense resistors 32H and 32L, comparators 33H and 33L, and a logic operation OR circuit 34.

A source of the transistor 31-1 is connected to a source of the transistor 11 via a sense resistor 32H. A drain of the transistor 31-1 is connected to a drain of the transistor 11. A gate of the transistor 31-1 is connected to a gate of the transistor 11.

A source of the transistor 31-2 is connected to a source of the transistor 12 via the sense resistor 32H. A drain of the transistor 31-2 is connected to a drain of the transistor 12. A gate of the transistor 31-2 is connected to a gate of the transistor 12.

A source of the transistor 31-3 is connected to a source of the transistor 13 via the sense resistor 32L. A drain of the transistor 31-3 is connected to a drain of the transistor 13. A gate of the transistor 31-3 is connected to a gate of the transistor 13.

A source of the transistor 31-4 is connected to a source of the transistor 14 via the sense resistor 32L. A drain of the transistor 31-4 is connected to a drain of the transistor 14. A gate of the transistor 31-4 is connected to a gate of the transistor 14.

Currents I1 and I2 flow through switching elements at an upper side of the H-bridge circuit 10, and a mirror current IH (the behavior of which is the same as the current I1 or I2) flows through the sense resistance 32H. Current I3 and current I4 flow through switching elements at a low side of the H-bridge circuit 10, and a mirror current IL (the behavior of which is the same as the current I3 or I4) flows through the sense resistance 32L. A ratio of the mirror current IH and both of the current I1 and the current I2 is set to about 1:1000. Also a ratio of the mirror current IL and both of the current I3 and the current I4 is set to about 1:1000. Thus, a gate area of the transistors 31-1 to 31-4 is designed to be about thousands of times smaller than a gate area of the transistors 11 to 14.

A non-inverting input terminal (+) of the comparator 33H is connected to a first terminal (a high level potential terminal) of the sense resistance 32H. An inverting input terminal (−) of the comparator 33H is connected to a second terminal (a low level potential terminal) of the sense resistance 32H. An output terminal of the comparator 33H is connected to a first input terminal of the logic operation OR circuit 34.

A non-inverting input terminal (+) of the comparator 33L is connected to a first terminal (a high level potential terminal) of the sense resistance 32L. An inverting input terminal (−) of the comparator 33L is connected to a second terminal (a low level potential terminal) of the sense resistance 32L. An output terminal of the comparator 33L is connected to a second input terminal of the logic operation OR circuit 34.

In the foregoing over current protection circuit 30, comparison signals S4H and S4L from the comparators 33H and 33L change to a high level (an abnormal logic level) if each of the mirror currents IH and IL exceeds a predetermined upper value. Likewise, comparison signals S4H and S4L change to a low level (a normal logic level) if each of the mirror currents IH and IL are lower than a predetermined upper value.

An output terminal of the logic operation OR circuit 34 corresponds to an output terminal of the over current protection circuit 34. The over current protection signal S4 is calculated by a logical OR operation of the comparison signals S4H and S4L from the comparators 33H and 33L. Thus, the over current protection signal S4 changes to a high level if either of the comparison signals S4H or S4L is at a high level. The over current protection signal S4 changes to a low level if both of the comparison signals S4H and S4L are at a low level.

Thus, the foregoing over current protection circuit 30 detects the currents I1 to I4 flowing through the transistors 11 to 14 as the mirror currents IH and IL. If any of the currents I1 to I4 exceeds a predetermined upper value, the over current protection circuit 30 determines that an over current state has occurred, and the over current signal S4 changes to a high level (an abnormal logic level). The construction of the over current protection circuit 30 is not limited to the foregoing example, any constructions can be used as long as an over current protection signal S4 same as above can be generated.

A description for a circuit block included in the motor driving IC 1 is described in reference to FIG. 1.

The constant current chopping circuit 40 detects a sink current Irnf flowing through a sense resistor R5 of the H-bridge circuit 10, and tries to maintain the sink current Irnf at a predetermined target value by chopping an ON period of the transistors 11 to 14. The constant current chopping circuit 40 includes PWM (Pulse Width Modulation) timer 41, an amplifier 42, a digital-to-analog converter 43 (DAC 43), and a comparator 44.

The PWM timer 41 generates a PWM duty control signal S2 (a triangle wave signal) to determine the PWM duty for chopping an ON period of the transistors 11 to 14, and provides the PWM duty control signal S2 to the control circuit 20.

Figure 3:
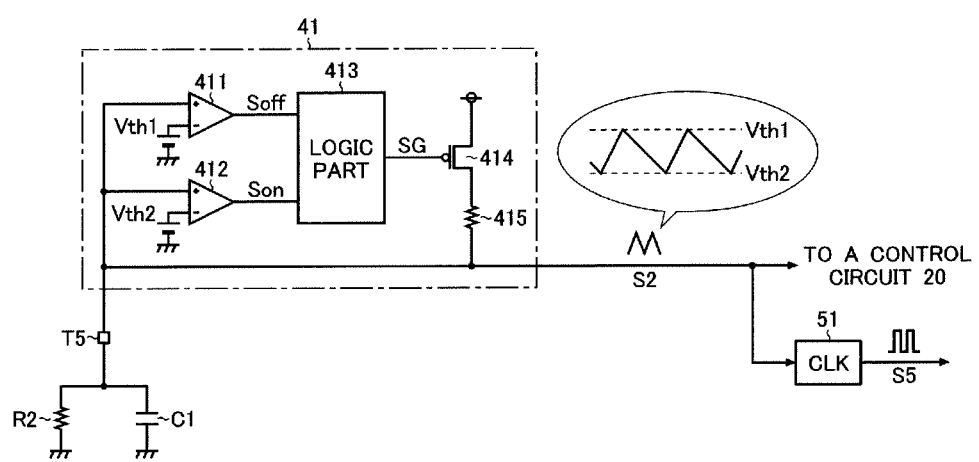
FIG. 3 is a diagram showing an example of a PWM timer 41.

FIG. 3 is a diagram showing an example of a PWM timer 41. As shown in FIG. 3, the PWM timer includes a comparator 411, a comparator 412, a logic part 413, a PMOS transistor 414 and a resister 415.

Each of non-inverting input terminals (+) of the comparators 411, 412 is connected to an external terminal T5. An externally installed resistance R2 and a capacitor C1 are connected in parallel between the output external terminal T5 and a ground terminal. An inverting terminal (−) of the comparator 411 is connected to a terminal to which a first threshold voltage Vth1 is provided. An inverting terminal (−) of the comparator 412 is connected to a terminal to which a second threshold voltage Vth2 (Vth2<Vth1) is provided. An output terminal of the comparator 411 is connected to an OFF signal input terminal of a logic part 413. An output terminal of the comparator 412 is connected to an ON signal input terminal of a logic part 413. A source of the transistor 414 is connected to the power source terminal. A drain of the transistor 414 is connected to the external terminal T5 via a resistance 415. A gate of the transistor 414 is connected to a gate signal output terminal of the logic part 413. The external terminal T5 is connected to a control circuit 20 as an output terminal of a PWM duty control signal S2, and also connected to a clock pulse generator 51 of the abnormality detection circuit 50.

For the foregoing PWM timer 41, the comparator 411 provides a high level signal as an OFF signal Soff if the PWM duty control signal S2 exceeds the first threshold voltage Vth1. The comparator 411 provides a low level signal as the OFF signal Soff if the PWM duty control signal S2 is lower than the first threshold voltage Vth1. The comparator 412 provides a high level signal as the ON signal Son if the PWM duty control signal S2 exceeds the second threshold voltage Vth2. The comparator 412 provides a low level signal as the ON signal Son if the PWM duty control signal S2 is lower than the second threshold voltage Vth2.

An ON signal Son is provided from the comparator 412 to the logic part 413, then triggered by the falling edge of the ON signal Son, the logic part 413 turns ON the transistor 414. An OFF signal Soff is provided from the comparator 411 to the logic part 413, then triggered by the rising edge of the OFF signal Soff, the logic part 413 generates a gate signal SG to turn OFF the transistor 414. Thus, ON-OFF control of the transistor 414 causes the PWM duty control signal S2 to change to a triangle signal wave that oscillates between the first threshold voltage Vth1 and the second threshold voltage Vth2.

For the foregoing PWM timer 41, an oscillation frequency (rising/falling rate of a slope) of the PWM duty control signal S2 is adjusted in response to an adjustment of a resistance value of the resistance R2 and a capacitance value of the capacitor C1.

A description for circuitry elements included in the constant current chopping circuit 40 is described in reference to FIG. 1.

A non-inverting input terminal (+) of the amplifier 42 is connected to an external terminal T7. An external resistance R3 is connected between the external terminal T7 and the power source terminal. An external terminal resistance R4 is connected between the external terminal T7 and the ground terminal. An inverting terminal (−) of the amplifier 42 is connected to an output terminal of the amplifier 42. An output terminal of the amplifier 42 is connected to a driving voltage input terminal of the DAC 43. The amplifier 42 functions as a buffer amplifier to supply a DAC driving voltage Vref0 to the DAC 43 provided via an external terminal T7. The DAC driving voltage Vref0 is adjusted by adjusting a resistance value of the resistances R3 and R4.

A DAC driving voltage Vref0 is provided to the DAC 43, and the DAC 43 generates a reference voltage Vref in response to digital to analog conversion of a x-bit digital signal S8 provided to the DAC 43 via an external terminal T6. Thus, the reference voltage Vref (Vref=Vref0*(x/2x−1)) is adjusted according to a value X (a value between 0 and 2x−1) of a digital signal S8.

A non-inverting input terminal (+) of the comparator 44 is connected to an output terminal of the DAC 43. An inverting terminal (−) of the comparator 44 is connected to one end (a high level potential terminal) of a resistance R5. An output terminal of the comparator 44 is connected to a chopping signal input terminal of the control circuit 20. Thus, the comparator 44 compares a feedback voltage Vrnf (the voltage level of the feedback voltage Vrnf changes according to the sink current Irnf flowing through the sense resistance 5) provided from one end of the resistance R5 with the predetermined reference voltage Vref (Vref equivalents to a predetermined desired value of the sink current Irnf), generates a chopping control signal S3 which indicates whether or not to chop an ON period of the transistors 11 to 14, and provides the chopping control signal S3 to the control circuit 20.

The comparator 44 provides a low level signal (a logic level for a chopping period) as the chopping signal S3 if a feedback voltage Vrnf is higher than the reference voltage Vref. The comparator 44 provides a high level signal (a logic level for a no chopping period) as the chopping signal S3 if a feedback voltage Vrnf is lower than the reference voltage Vref.

If the sink current Irnf is lower than the predetermined desired value, the feedback voltage Vrnf becomes lower than the reference voltage Vref and the chopping control signal Sa changes to high level. The control circuit 20 determines that chopping an ON period of the transistors 11 to 14 is not required. If the sink current Irnf is higher than the predetermined target value, the feedback voltage Vrnf becomes higher than the reference voltage Vref and the chopping control signal Sa changes to low level. The control circuit 20 determines that chopping an ON period of the transistors 11 to 14 is required. Thus, constant current chopping keeps the sink current Irnf at the predetermined target value.

The abnormality detection circuit 50 monitors the sink current Irnf of the H-bridge circuit 10 and determines the presence of an abnormal state if the sink current Irnf is not detected for a predetermined time. The abnormality detection circuit 50 includes a clock pulse generator 51, a counter 52 and a NMOS transistor 53.

The clock pulse generator 51 generates a clock pulse S5 of a predetermined frequency according to the PWM duty control signal S2. This example makes it possible not to install an extra oscillator to set an abnormality detection time Td (described below). Thus, a circuit scale enlargement can be avoided. Also, in response to adjusting of a resistance value of the resistance R2 and the capacitance value of the capacitor C1, an abnormality detection time Td according to a motor time constant can be adjusted.

A count value is incremented every time the clock pulse S5 is provided to the counter 52. The count value is reset when the sink current Irnf is detected, and generates a first abnormality detection signal S6 which changes to a high level (an abnormal logic level) from a low level (a normal logic level) when the count value reaches a predetermined value N without being reset.

The counter 52 uses an enable signal S1 as a count start signal, and also uses the chopping control signal S3 as the counter reset signal. That is, if the sink current Irnf exceeding the predetermined target value is detected, and if the chopping control signal S3 changes to a low level, then the count value counted by the counter 52 is reset. Thus, if the sink current Irnf exceeding the predetermined target value is not detected for the abnormality detection time Td, and if the chopping control signal S3 is maintained at a high level and the count value reaches the predetermined value N without being reset, then the first abnormality detection signal S6 changes to a high level from a low level.

A drain of the transistor 53 is connected to an external terminal T4. A source of the transistor 53 is connected to a ground terminal. A gate of the transistor 53 is connected to an output terminal (an output terminal of the first abnormality detection signal S6) of the counter 52. The transistor 53 is turned OFF when the abnormality detection signal S6 is low level (a normal logic level), the transistor 53 is turned ON when the abnormality detection signal S6 is high level (an abnormal logic level).

The external terminal T4 is used to provide abnormality detection signal S7 from motor driving IC 1 to a micro computer (not illustrated). The external terminal T4 is pulled up to a power source terminal via an externally installed resistance R1. That is, if the first abnormality detection signal S6 is a low level and the transistor 53 is turned OFF, the abnormality detection signal S7 changes to a high level (a normal logic level). If the first abnormality detection signal S6 is a high level and the transistor 53 is turned ON, the abnormality detection signal S7 changes to a low level (an abnormal logic level).

Thus, the transistor 53 functions as output circuitry of an open drain type which provides the abnormality detection signal S7 to a location outside the motor driving IC 1.

Figure 4:
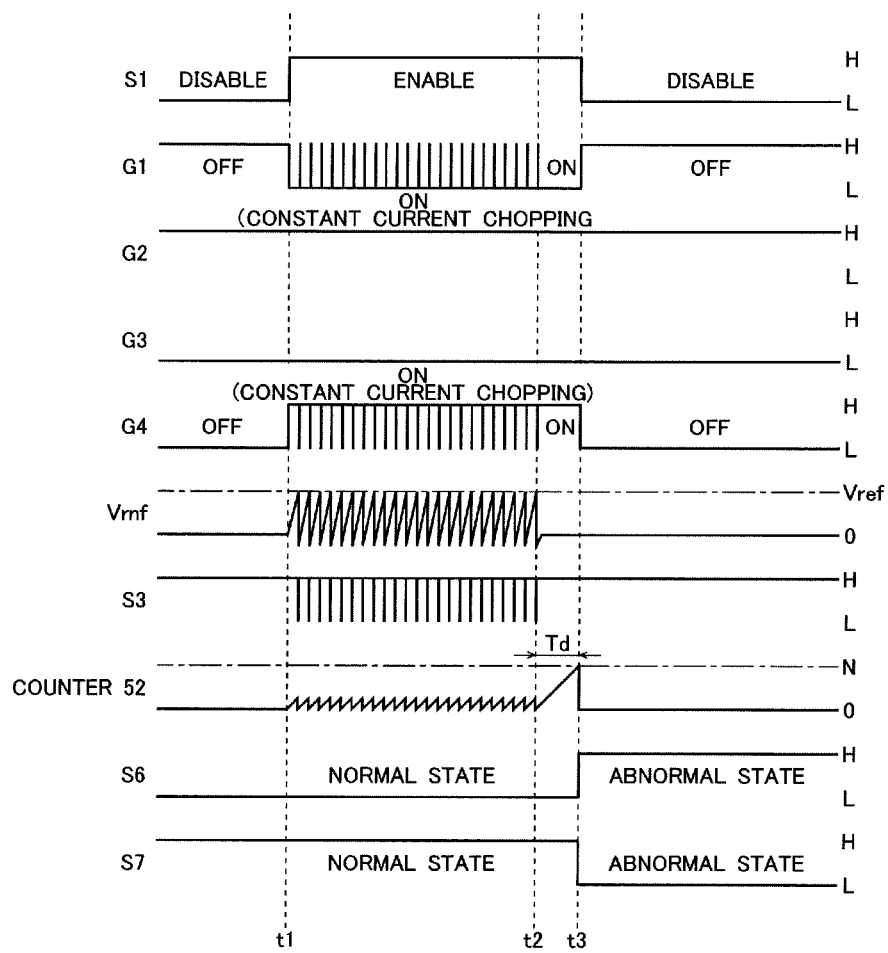
FIG. 4 is a diagram showing an example of an abnormality detection operation.

Operation of the abnormality detection circuit 50 is described in reference to FIG. 4. FIG. 4 is a diagram showing an example of an abnormality detection operation. Starting from the top of the diagram, an enable signal S1, gate signals G1 to G4, a feedback voltage Vrnf, a chopping control signal S3, a count value of the counter 52, a first abnormality detection signal S6, and an abnormality detection signal are illustrated. The following description is based on the assumption that a ground fault occurs at the external terminal T2 while the H-bridge circuit 10 is maintained in a first operating state (a state the transistors 11 and 14 are ON state and the transistors 12 and 13 are OFF state).

ON-OFF control for the transistors 11 to 14 by the control circuit 20 is started when the enable signal S1 changes to a high level (an enable logic level) from a low level (a disable logic level) at time t1. In the example of FIG. 4, to operate H-bridge circuit 10 in the first operating state, the gate signals G1 to G4 are generated at the control circuit 20 to turn ON the transistors 11 and 14 and to turn OFF the transistors 12 and 13. That is, the gate signals G1 and G3 are basically at a low level and the gate signals G2 and G4 are basically at a high level.

As described above, when the H-bridge circuit 10 changes to the first operating state at time t1, the sink current Irnf begins to flow through to the resistance R5 from a power source to a ground terminal via the transistor 11 and the motor coil 2 and the transistor 14. Then the feedback Vrnf begins to rise. For the constant current chopping circuit 40, as described above, the PWM duty control signal S2 and the chopping control signal S3 are generated to equalize the feedback Vrnf with the predetermined reference voltage Vref. Then the gate signals G1 and G4 are generated to chop an ON period of the transistors 11 and 14 according to the control signals S2 and S3 at the control circuit 20.

When the enable signal S1 is raised to a high level from a low level at time t1, the counter 52 starts a count for the clock pulse S5. If a ground fault or an open fault has not occurred at the H-bridge circuit 10, the sink current Irnf kept at the predetermined value flows through the resistance R5. If the chopping control signal S3 is not kept at a high level for the abnormality detection time Td, then a count value of the counter 52 is reset without reaching a predetermined target value N. Then an increment is resumed from value zero. As a result, the first abnormality detection signal S6 is kept at a low level (a normal logic level), and the abnormality detection signal S7 is kept at a high level (a normal logic level).

If a ground fault has occurred at the external terminal T2 at time t2, a current flowing through from a power source input terminal to the motor coil 2 via the transistor 11 flows through to a ground terminal via a current path caused by the ground fault (i.e., not a current path via the transistor 14 and the resistor R5). In such a situation, the sink current Irnf does not flow through the resistor R5, and the foregoing constant current chopping function does not work. Thus, both transistors 11 and 14 are ON (no chopping state).

After the sink current Irnf stops, the feedback voltage Vrnf becomes zero, and the chopping control signal S3 is maintained at a high level. Thus, a count value of the counter 52 is not reset during the abnormality detection time Td, and reaches a predetermined value N at time t3. As a result, the first abnormality detection signal S6 changes to a high level (an abnormal logic level) from a low level, and the transistor 53 is turned ON. Then the abnormality detection signal S7 changes to a low level (an abnormal logic level) from a high level.

Thus, by outputting the abnormality detection signal S7 to a location outside the motor driving IC 1, informing a user of the presence of an abnormal state of the motor driving IC 1 by the microcomputer (not illustrated) which receives the signal S7, can be realized. Also, a forcible shutdown of the motor driving IC 1 is realized by lowering the enable signal S1 provided to the motor driving IC 1. As shown by the dashed line in FIG. 1, a construction of a motor driving IC 1 to provide abnormality protection (turn OFF the transistors 11 to 14 forcibly) is realized by providing the abnormality detection signal S6 to the control circuit 20 without using a microcomputer.

Even if the H-bridge circuit 10 is in a normal state when the motor driving IC 1 is operating as a normal state, if a transition period of the sink current Irnf reaches a predetermined target value, the feedback voltage Vrnf does not reach a reference voltage Vref and the chopping control signal S3 is maintained at a high level. Therefore, to avoid a false detection of the H-bridge circuit 10 based on a state of the chopping control signal S3 is kept at a high level, the foregoing abnormality detection time Td is set (e.g., at a few milliseconds according to a motor time constant).

An operation of the abnormality detection is described above in reference to an example of a ground fault occurred at the external terminal T2 while the H-bridge 10 is in the first operating state. On the other hand, while the ground fault occurring at the external terminal T1 when the H-bridge 10 is in the second operating state, an abnormality detection operation or an abnormality protection operation can be realized because the sink current Irnf does not flow through the resistance R5.

Furthermore, if the ground fault occurs at the external terminal T1 while the H-bridge 10 is in the first operating state, or if a ground fault occurs at the external terminal T2 while the H-bridge 10 is in the second operating state, the sink current Irnf does not flow through the resistor R5. An abnormality protection operation can be realized because the sink current Irnf does not flow through the resistance R5. Furthermore, under such a condition, since a large current flows through the transistors 11 and 12, an over current protection operation can be realized by the over current protection circuit 30 to shut down the motor driving IC 1.

Thus, the motor driving IC 1 in accordance with the disclosure is able to detect a ground fault occurring at the external terminals T1 and T2 despite a motor driving condition. As a result, overheating or breakage of the motor or breakage of the motor driving IC 1 can be avoided. Improved reliability and safety of the motor driving IC 1 and an electrical apparatus using the same can be realized.

The sink current Irnf does not flow through the resistance R5—not only in case of the ground fault occurs at an external terminal T1 and T2—but also in case open of an electrical connection (i.e., open fault caused by a detachment of a connector) occurs at an external terminal T1 and T2. Thus, an abnormality detection operation and an abnormality protection operation can be realized.

Thus, for the motor driving IC 1 in accordance with the disclosure, an open fault occurring at the external terminal T1 and T2 can be detected quickly, and a user can be informed of the presence of an abnormality promptly. Accordingly, fatal breakage of an electrical apparatus using the motor driving IC 1 can be avoided.

An example of an electrical apparatus using the motor driving IC is described below in reference to FIGS. 5 to 8. FIGS. 5 to 8 are diagrams showing examples of an electrical apparatus using a motor driving IC.

Figure 5:
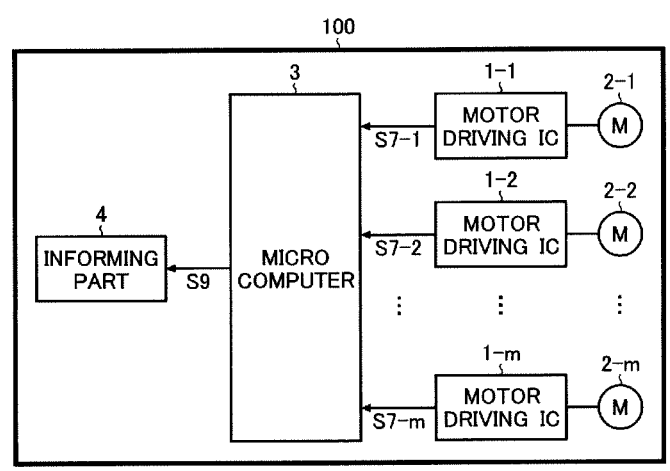
FIG. 5 is a diagram showing a first example of an electrical apparatus of the invention.

As shown in FIG. 5, an electrical apparatus 100 of a first example includes m motor driving ICs 1-1 to 1-m, m motors 2-1 to 2-m, a microcomputer 3, and an informing part 4.

The motor driving ICs 1-1 to 1-m can be implemented as semiconductor devices to drive motors 2-1 to 2-m, respectively. An internal construction of the motor driving ICs can be the same as the motor driving device 1.

The motors 2-1 to 2-m are driven by motor driving ICs 1-1 to 1-m, respectively. As an example, a stepping motor or a DC brushed motor can be used. If the electrical apparatus 100 is a copy machine, a motor for a toner box for withdrawing the used toner, or a motor for toner distribution, can be used as the motors 2-1 to 2-m.

The microcomputer 3 generates an information control signal S9 in response to receiving abnormality detection signals S7-1 to S7-m from motor driving IC2 1-1 to 1-m.

The informing part 4 informs a user of the presence of an abnormal state in accordance with the information control signal S9 from the microcomputer 3. A control panel of an electrical apparatus 100, a display or a speaker can be used as the informing part 4.

Thus, for a construction which provides abnormality detection signals S71- to S7-m to the microcomputer 3 from the motor driving ICs 1-1 to 1-m, the location of an abnormality can be detected at once. Also, to inform a user of the location of an abnormality can be realized by using the informing part 4 such as a control panel. As a result, shortening of maintenance periods, enhancement of operation efficiency or cost reduction can be realized.

Figure 6:
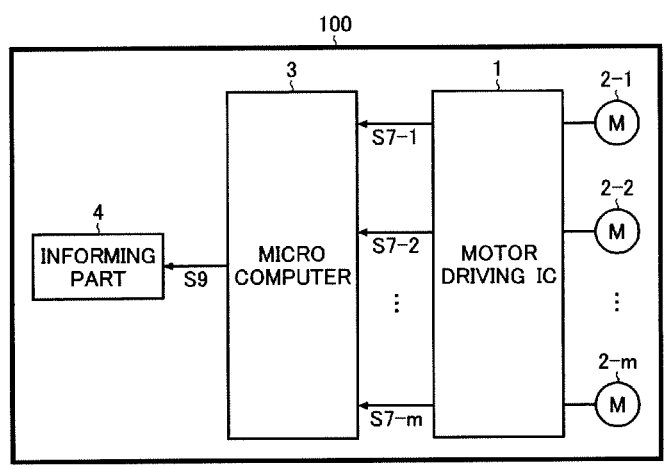
FIG. 6 is a diagram showing a second example of an electrical apparatus of the invention.

A second example of an electrical apparatus 100 shown in FIG. 6 has a construction similar to the first example of the electrical apparatus (i.e., m motor driving ICs 1-1 to 1-m are integrated as one motor driving IC). That is, m motors 2-1 to 2-m are connected to the motor driving IC 1 of this example. The motor driving IC 1 has a configuration to provide abnormality detection signals S7-1 to S7-m to the motors 2-1 to 2-m respectively, as in the first example.

This example makes it possible to realize not only a similar effect as in the first example, but also to decrease the area of the motor driving IC 1. Thus, miniaturization of the electrical apparatus 100 can be realized.

Figure 7:
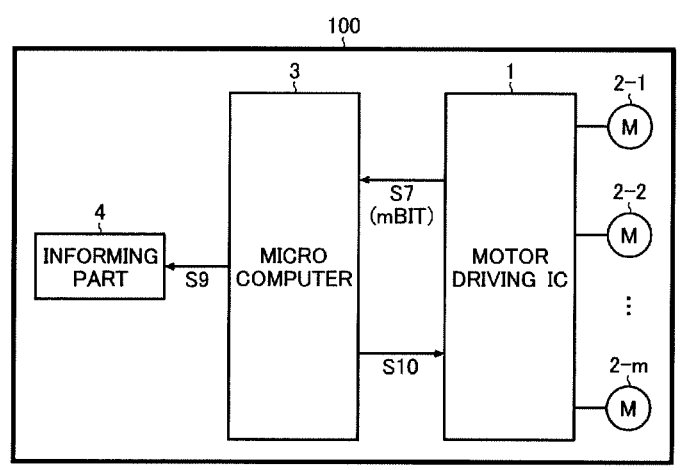
FIG. 7 is a diagram showing a third example of an electrical apparatus of the invention.

A third example of an electrical apparatus 100, as shown in FIG. 7, has a similar construction as the second example (i.e., m streams of the abnormality detection signal S7-1 to S7-m is integrated to an abnormality detection signal S7 of a single stream). The motor driving IC 1 provides abnormality detection signal S7 in response to receiving the diagnosis requirement signal. The abnormality detection signal S7 is serial m-bit data. Abnormality detection results corresponding to the motors 2-1 to 2-m are included in the serial data bits.

The following description is based on the assumption that three motors 2-1 to 2-3 are connected to a motor driving IC 1. In such a case, the abnormality detection signal S7 is 3-bit serial data. For example, the most significant bit (the third digit=the highest digit) can contain an abnormality detection result of an external terminal connecting the motor driving IC 1 to the motor 2-1, the middle digit (the second digit) can contain an abnormality detection result of an external terminal connecting the motor driving IC 1 to the motor 2-2, and the least significant bit (the first digit=the lowest digit) can contain an abnormality detection result of an external terminal connecting the motor driving IC 1 to the motor 2-3. For example, the abnormality detection signal S7 provides [100 (3-bit data)] in the event that a ground fault or an open fault occurred at an external terminal connecting motor driving IC 1 to the motor 2-1.

This example makes it possible to realize—not only the same effect as in the second example—but also a decrease in the number of signal lines between the motor driving IC 1 and the microcomputer 3. Thus, miniaturization of an electrical apparatus 100 can be realized.

Figure 8:
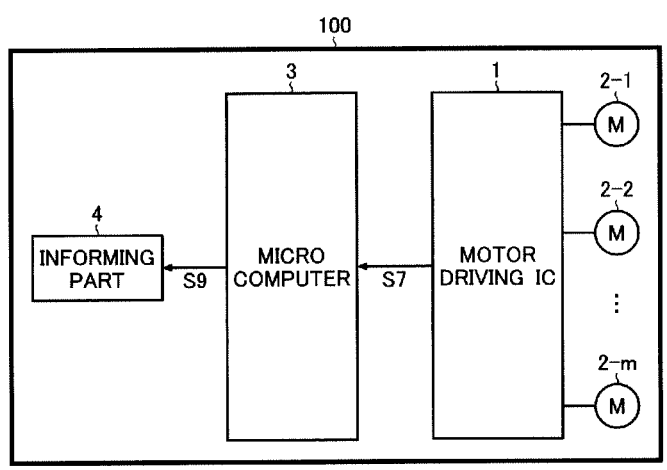
FIG. 8 is a diagram showing a fourth example of an electrical apparatus of the invention.

A fourth example of an electrical apparatus 100, as shown in FIG. 8, has a simplified construction compared to the third example. This implementation of the apparatus 100 provides a logic operation AND signal of the signals S7-1 to S7-m of m streams, or logic operation OR signal, or a majority signal.

This example makes it possible to provide the abnormality detection signal constantly S7 without receiving a diagnosis requirement signal from the microcomputer 3. However, when using a motor driving of the fourth example, it may not be able to detect that an abnormality has occurred at a specific external terminal.

Figure 9:
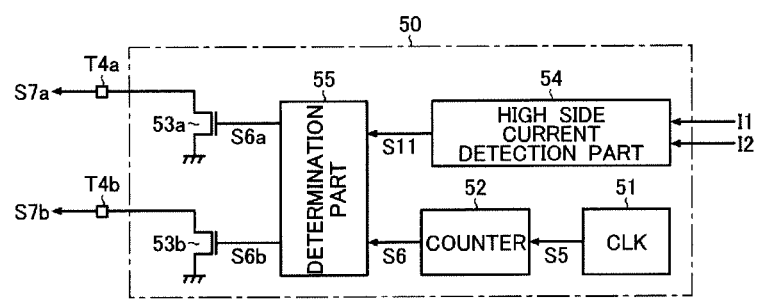
FIG. 9 is a diagram showing an another example of an abnormality detection circuit 50.

A method to discriminate a ground fault and an open fault is described. FIG. 9 is a diagram showing another example of an abnormality detection circuit 50. The abnormality detection circuit 50 includes components of the abnormality detection circuit 50 shown in FIG. 1, and further includes high side current detection circuitry 54 and determination circuitry 55.

Also, the abnormality detection circuit 50 separates a single stream transistor 53 into two stream transistors 53a and 53b. The ground fault detection signal S7a and the open fault detection signal S7b are provided separately to a location outside the abnormality detection circuit 50.

The high side current detection circuitry 54 monitors high side currents I1 to I2 flowing through a switching element at the upper side (the transistors 11 to 12) of the H-bridge circuit 10, and generates a second abnormality detection signal S11.

Figure 10:
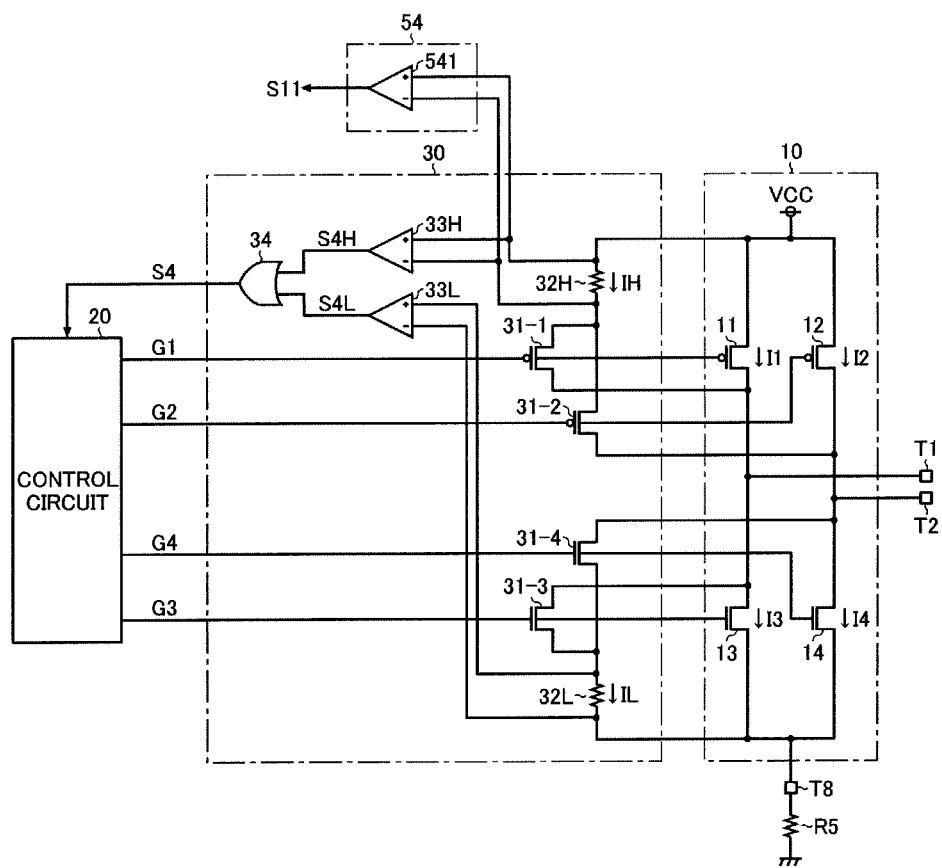
FIG. 10 is a diagram showing an example of high side current detection circuitry 54.
Figure 12A:
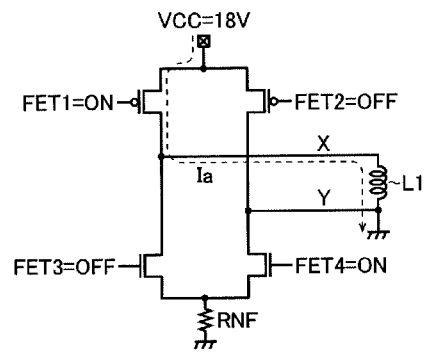
FIG. 12A is a diagram showing a motor driving device in accordance with the related art (showing a first state of a H-bridge circuit).
Figure 12B:
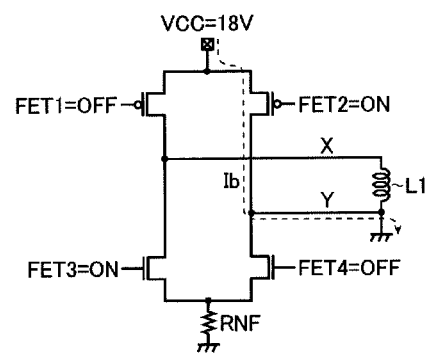
FIG. 12B is a diagram showing a motor driving device in accordance with the related art (showing a second state of a H-bridge circuit).

FIG. 10 shows an example of high side current detection circuitry 54. The current detection circuitry 54 includes a portion of the over current protection circuit 30 shown in FIG. 2. Also, the over current protection circuit 30, which includes a comparator 541, detects whether or not the high side currents I1 and I2 are flowing.

A non-inverting terminal (+) of the comparator 541 is connected to a first terminal (a high level potential terminal) of the sense resistance 32H. An inverting terminal (−) of the comparator 541 is connected to a second terminal (a low level potential terminal) of the sense resistance 32H. An output terminal of the comparator 531 equivalents to an output terminal of the second abnormality detection signal S11.

For the foregoing high side current detection circuitry 54, the second abnormality detection signal S11 from the comparator 541 changes to a high level (a logic level in response to current detection) when a mirror current IH is higher than a predetermined threshold value (a much smaller value than a predetermined upper value of the over current protection circuit 30). The second abnormality detection signal S11 changes to a low level (a logic level in response to no current detection) when the mirror current IH does not reach the predetermined threshold value.

Thus, the high side current detection circuitry 54 of this example detects the high side currents I1 and I2 flowing through switching elements at the upper side of the H-bridge circuit (i.e., transistors 11 and 12) by utilizing a mirror current IH. If either the high side current I1 or 12 is higher than the predetermined threshold value, the high side current detection circuitry 54 determines as a high side current is flowing through and provides the second abnormality detection signal S11 as a high level (a logic level in response to a current detection). The composition of the high side current detection circuitry 54 is not limited to the foregoing construction. Any construction can be adopted as long as the same second abnormality detection signal S11 can be generated.

A description for a circuit element of the abnormality detection circuit 50 is described below in reference to FIG. 9.

The determination circuitry 55 determines that an abnormality occurred at the H-bridge circuit 10 as a ground fault or an open fault in accordance with the first abnormality detection signal S6 and the second abnormality detection signal S11.

FIG. 11 shows input-output logic of determination circuitry 55, a first abnormality detection signal S6, the second abnormality detection signal S11, gate signals S6a and S6b, a ground fault detection signal S7a, an open fault detection signal S7b, and a result of the determination are illustrated.

If both the first abnormality detection signal S6 and the second abnormality detection signal S11 are at a high level as shown in FIG. 11 (i.e., if the sink current Irnf is not flowing through and either the high side current I1 or I2 is flowing through), the determination circuitry 55 determines that a ground fault has occurred at one or the external terminals T1 or T2, then sets the gate signal S6a at a high level, and sets the gate signal S6b at a low level. As a result, the transistor 53a is turned ON, and the transistor 53b is turned OFF. Then the ground fault detection signal S7a changes to a low level (an abnormal logic level), and the open fault detection signal S7b changes to a high level (a normal logic level).

If the first abnormality detection signal S6 is at a high level and the second abnormality detection signal S11 is at a low level (i.e., if the sink current Irnf and both of the high side currents I1 and I2 are not flowing through), the determination circuitry 55 determines that an open fault has occurred in one of the external terminals T1 or T2, sets the gate signal S6a at a low level and sets the gate signal S6b. As a result, the transistor 53a turns OFF and the transistor 53b turns ON. Then the ground fault detection signal S7a changes to a high level (a normal logic level), and the open fault detection signal S7b changes to a low level (an abnormal logic level).

If the first abnormality detection signal S6 is at a low level (i.e., if the sink current Irnf is flowing through), the determination circuitry 55 determines that no fault has occurred in either of the external terminals T1 and T2, without receiving the second abnormality detection signal S11. Then the determination circuitry 55 sets the gate signals S6a and S6b at a low level. As a result, both transistors 53a and 53b turn OFF, and the ground fault detection signal S7a and the open fault detection signal S7b change to a high level (a normal logic level).

By using the abnormality detection circuit 50, an abnormality occurring at the H-bridge circuit 10 can be identified as a ground fault or an open fault, and improved maintenance can be realized.

Although particular examples applied to a motor driving IC 1 are described above, the invention is not limited to these examples, and can be applied to other load driving devices such as a H-bridge circuit as an output stage.

An overview of the disclosure is described below.

In an aspect, an abnormality detection circuit includes first circuitry arranged to monitor a sink current which flows through a H-bridge circuit, and includes second circuitry arranged to determine the presence of an abnormal state if the sink current is not detected by the first circuitry for a predetermined time.

In some implementations, the abnormality detection circuit includes a clock pulse generator arranged to generate a clock pulse of a predetermined frequency, and a counter arranged so that a count value is incremented every time the clock pulse is provided to the counter and arranged so that the count value is reset when the sink current is detected. The counter generates a first abnormality detection signal changes from a normal logic level to an abnormal logic level when the count value reaches a predetermined value without being reset.

In some implmentatations, the abnormality detection circuit includes high side current detection circuitry arranged to monitor a high side current flowing through a switching element at an upper side of the H-bridge circuit, and arranged to generate a second abnormality detection signal. Determination circuitry is arranged to identify a fault occurring in the H-bridge circuit as a ground fault or as an open fault, according to the first abnormality detection signal and the second abnormality detection signal.

The load driving device can include a H-bridge circuit that includes four switching elements, a control circuit to control ON-OFF state of the switching elements, and an abnormality detection circuit.

In some implementations, the load driving device includes a constant current chopping circuit to generate a chopping control signal which determines whether or not to chop an ON period of the switching elements based on a comparison between the sink current and a predetermined desired value. The chopping control signal can be provided to the control circuit, and the counter can be arranged to use the chopping control signal as a reset signal.

In some implementations, the constant current chopping circuit includes a PWM timer to generate a PWM duty control signal to determine a PWM duty used for chopping an ON period of the switching elements. The PWM duty control signal can be provided to the control circuit. The clock pulse generator can generate the clock pulse according to the PWM duty control signal.

The load driving device can include an over current protection circuit to compare a current flowing through the switching elements with a predetermined upper value, and to generate an over current protection signal to determine whether or not to turn OFF the switching elements forcibly. The over current protection signal can be provided to the control circuit.

In some implementations, the abnormality detection circuit includes output circuitry to provide an abnormality detection signal according to the first abnormality detection signal. The abnormality detection signal can be provided to a location outside the load driving device.

According to another aspect, an electrical apparatus includes a load and a load driving device to drive and control the load. A microcomputer generates an information control signal in response to receiving an abnormality detection signal from the load driving device, and an informing part provide a signal indicative of an abnormal state according to the information control signal.

In some implementations, the microcomputer provides a diagnosis requirement signal to the load driving device, and the load driving device provides the abnormality detection signal in response to receiving the diagnosis requirement signal.

In some implementations, multiple loads are connected to the load driving device, and abnormality detection results for respective loads include serial data bits in the abnormality detection signal. Thus, the electrical apparatus is formed to construct an eleventh configuration.

The abnormality detection circuit, load driving device and electrical apparatus can, in some cases, improve detection of a ground fault or an open fault.

The abnormality detection circuit can, in some cases, enhance reliability and safety for a motor driving IC as well as an electrical apparatus using the abnormality detection circuit.

A number of implementations of the invention have been described. Nevertheless, various modifications can be made without departing from the spirit and scope of the invention. Accordingly, other implementations are within the scope of the claims.

LIST OF REFERENCE NUMERALS 1, 1-1 to 1-*m* motor driving IC (load driving device)
2, 2-1 to 2-*m* motor coil (load)
3 microcomputer
4 informing part
10 H-bridge circuit
11, 12 PMOS transistor (high side switch)
13, 14 NMOS transistor (low side switch)
20 control circuit
30 over current protection circuit
31-1, 31-2 PMOS transistor
31-3, 31-4 NMOS transistor
32H, 32L sense resistor
33H, 33L comparator
34 logic operation OR circuit
40 constant current chopping circuit
41 PWM timer
411, 412 comparator
413 logic part
414 PMOS transistor
415 resistor
42 amplifier
43 digital/analog converter
44 comparator
50 abnormality detection circuit
51 clock pulse generator
52 counter
53, 53*a*, 53*b* NMOS transistor
54 high side current detection circuitry
541 comparator
55 determination circuitry
100 electrical apparatus
T1 to T8, T4*a*, T4*b* external terminal
R1 to R4 resistor
R5 sense resistor
C1 capacitor

What is claimed is:

1. An abnormality detection circuit comprising:
   first circuitry arranged to monitor a sink current which flows through a H-bridge circuit;
   second circuitry arranged to determine the presence of an abnormal state if the sink current is not detected by the first circuitry for a predetermined time;
   a clock pulse generator arranged to generate a clock pulse of a predetermined frequency; and
   a counter arranged so that a count value is incremented every time the clock pulse is provided to the counter and arranged so that the count value is reset when the sink current is detected, wherein the counter generates a first abnormality detection signal changes from a normal logic level to an abnormal logic level when the count value reaches a predetermined value without being reset.

2. The abnormality detection circuit according to claim 1 comprising:
   high side current detection circuitry arranged to monitor a high side current flowing through a switching element at an upper side of the H-bridge circuit, and arranged to generate a second abnormality detection signal; and
   determination circuitry arranged to identify a fault occurring in the H-bridge circuit as a ground fault or as an open fault, according to the first abnormality detection signal and the second abnormality detection signal.

3. A load driving device comprising:
   a H-bridge circuit that comprises four switching elements;
   a control circuit to control ON-OFF state of the switching elements; and
   an abnormality detection circuit, wherein the abnormality detection circuit comprises:
      a clock pulse generator arranged to generate a clock pulse of a predetermined frequency; and
      a counter arranged so that a count value is incremented every time the clock pulse is provided to the counter, and arranged so that the count value is reset when the sink current is detected, the counter further arranged to generate a first abnormality detection signal changes from a normal logic level to an abnormal logic level when the count value reaches the predetermined value without being reset.

4. The load driving device according to claim 3 comprising:
   a constant current chopping circuit to generate a chopping control signal which determines whether or not to chop an ON period of the switching elements based on a comparison between the sink current and a predetermined desired value, wherein the chopping control signal is provided to the control circuit, wherein the counter is arranged to use the chopping control signal as a reset signal.

5. The load driving device according to the claim 4, wherein the constant current chopping circuit comprises:
a PWM timer to generate a PWM duty control signal to determine a PWM duty used for chopping an ON period of the switching elements, wherein the PWM duty control signal is provided to the control circuit; and
wherein the clock pulse generator generates the clock pulse according to the PWM duty control signal.

6. The load driving device according to the claim 3 comprising:
an over current protection circuit to compare a current flowing through the switching elements with a predetermined upper value, and to generate an over current protection signal to determine whether or not to turn OFF the switching elements forcibly, wherein the over current protection signal is provided to the control circuit.

7. The load driving device according to claim 3 arranged so that the abnormality detection circuit comprises output circuitry to provide an abnormality detection signal according to the first abnormality detection signal, wherein the abnormality detection signal is provided to a location outside the load driving device.

8. An electrical apparatus comprising:
a load;
a load driving device to drive and control the load;
a microcomputer to generate an information control signal in response to receiving an abnormality detection signal from the load driving device; and
an informing part to inform an abnormal state according to the information control signal;
wherein the load driving device comprises:
a H-bridge circuit that comprises four switching elements;
a control circuit to control ON-OFF states of the switching elements; and
an abnormality detection circuit comprising:
a clock pulse generator to generate a clock pulse of a predetermined frequency;
a counter arranged such that a count value is incremented every time the clock pulse is provided to the counter, wherein the count value is reset when the sink current is detected, the counter further arranged to generate a first abnormality detection signal from a normal logic level to an abnormal logic level when the count value reaches a predetermined value without being reset; and
output circuitry to provide the abnormality detection signal according to the first abnormality detection signal, the abnormality detection signal is provided to a location outside the load driving device.

9. The electrical apparatus according to the claim 8, wherein the microcomputer provides a diagnosis requirement signal to the load driving device, and the load driving device provides the abnormality detection signal in response to receiving the diagnosis requirement signal.

10. The electrical apparatus according to claim 9 arranged so that multiple loads are connected to the load driving device, and abnormality detection results for respective loads comprise serial data bits in the abnormality detection signal.

11. The load driving device according to claim 3, wherein the abnormality detection circuit comprises:

high side current detection circuitry which monitors a high side current flowing through a switching element at an upper side of the H-bridge circuit and generates a second abnormality detection signal; and
determination circuitry arranged to identify a fault occurring in the H-bridge circuit as a ground fault or as an open fault, according to the first abnormality detection signal and the second abnormality detection signal.

12. The load driving device according to claim 11 comprising:
a constant current chopping circuit to generate a chopping control signal which determines whether or not to chop an ON period of the switching elements based on a comparison between the sink current and a predetermined desired value, wherein the chopping control signal is provided to the control circuit,
and wherein the counter uses the chopping control signal as a reset signal.

13. The load driving device according to claim 12, wherein the constant current chopping circuit comprises:
a PWM timer to generate a PWM duty control signal to determine a PWM duty utilized for chopping an ON period of the switching elements, wherein the PWM duty control signal is provided to the control circuit; and
wherein the clock pulse generator generates the clock pulse according to the PWM duty control signal.

14. The load driving device according to claim 4 comprising:
an over current protection circuit to compare a current flowing through the switching elements with a predetermined upper value, and to generate an over current protection signal to determine whether or not to turn OFF the switching elements forcibly, wherein the over current protection signal is provided to the control circuit.

15. The load driving device according to claim 4, wherein the abnormality detection circuit comprises output circuitry to provide an abnormality detection signal according to the first abnormality detection signal, wherein the abnormality detection signal is provided to a location outside the load driving device.

16. The load driving device according to claim 11 comprising:
an over current protection circuit to compare a current flowing through the switching elements with a predetermined upper value, and to generate an over current protection signal to determine whether or not to turn OFF the switching elements forcibly, wherein the over current protection signal is provided to the control circuit.

17. The load driving device according to claim 11, wherein the abnormality detection circuit comprises output circuitry to provide an abnormality detection signal according to the first abnormality detection signal, wherein the abnormality detection signal is provided to a location outside the load driving device.

18. The load driving device according to claim 12 comprising:
an over current protection circuit to compare a current flowing through the switching elements with a predetermined upper value, and to generate an over current protection signal to determine whether or not to turn OFF the switching elements forcibly, wherein the over current protection.

19. The load driving device according to claim 12, wherein the abnormality detection circuit comprises output circuitry to provide an abnormality detection signal according to the first abnormality detection signal, wherein the abnormality detection signal is provided to a location outside the load driving device.

\* \* \* \* \*